(12) United States Patent
Supper et al.

(10) Patent No.: US 7,375,536 B2
(45) Date of Patent: May 20, 2008

(54) ELECTRIC CIRCUIT FOR A CAPACITIVE SENSOR ELEMENT

(75) Inventors: Bernd Supper, Leonberg (DE); Reiner Stäble, Oberderdingen (DE)

(73) Assignee: E.G.O. Elektro-Geraetebau GmbH (DE)

( * ) Notice: Subject to any disclaimer, the term of this patent is extended or adjusted under 35 U.S.C. 154(b) by 495 days.

(21) Appl. No.: 10/371,568

(22) Filed: Feb. 21, 2003
(Under 37 CFR 1.47)

(65) Prior Publication Data
US 2004/0051396 A1    Mar. 18, 2004

(30) Foreign Application Priority Data
Feb. 27, 2002    (EP)    ................................ 02004453

(51) Int. Cl.
G01R 27/26    (2006.01)
G06M 1/10    (2006.01)
H01H 35/00    (2006.01)
H01H 83/00    (2006.01)

(52) U.S. Cl. ...................................... 324/661; 307/129
(58) Field of Classification Search ................ 307/129; 324/661
See application file for complete search history.

(56) References Cited

U.S. PATENT DOCUMENTS 4,363,029 A * 12/1982 Piliavin et al. ............. 340/501
5,012,124 A * 4/1991 Hollaway .................... 307/116
5,311,084 A * 5/1994 Gabara ....................... 327/170
5,325,068 A * 6/1994 Rauf ........................... 324/713
5,543,587 A * 8/1996 Ikura et al. .............. 178/18.01
5,585,733 A   12/1996 Paglione ..................... 324/678
5,917,165 A * 6/1999 Platt et al. .................. 200/600
5,933,102 A * 8/1999 Miller et al. .................. 341/33
5,973,417 A * 10/1999 Goetz et al. ................ 307/129
6,194,903 B1   2/2001 Schulz ........................ 324/661
6,897,390 B2 * 5/2005 Caldwell et al. ............ 200/512

FOREIGN PATENT DOCUMENTS

JP    2001-27655 A    1/2001
RO    112921 B    1/1998

* cited by examiner

*Primary Examiner*—Michael Sherry
*Assistant Examiner*—Hal I. Kaplan
(74) *Attorney, Agent, or Firm*—Akerman Senterfitt

(57) ABSTRACT

An electric circuit for capacitive sensor elements of a touch switch can be designed as a switch capacitor circuit and van be provided with a micro controller. The sensor elements are provided in sensor branches with a charging capacitor. In addition, a reference branch is provide. It contains a reference capacity and a reference charging capacitor, which have capacities that correspond to those of the sensor branches. By comparing the number of charge transfer processes required to reach the switching threshold in the sensor branch and the reference branch, fluctuations of the supply voltage, and consequently the switching threshold itself, can be compensated for.

25 Claims, 4 Drawing Sheets

ELECTRIC CIRCUIT FOR A CAPACITIVE SENSOR ELEMENT

FIELD OF APPLICATION AND PRIOR ART

Figure 1:
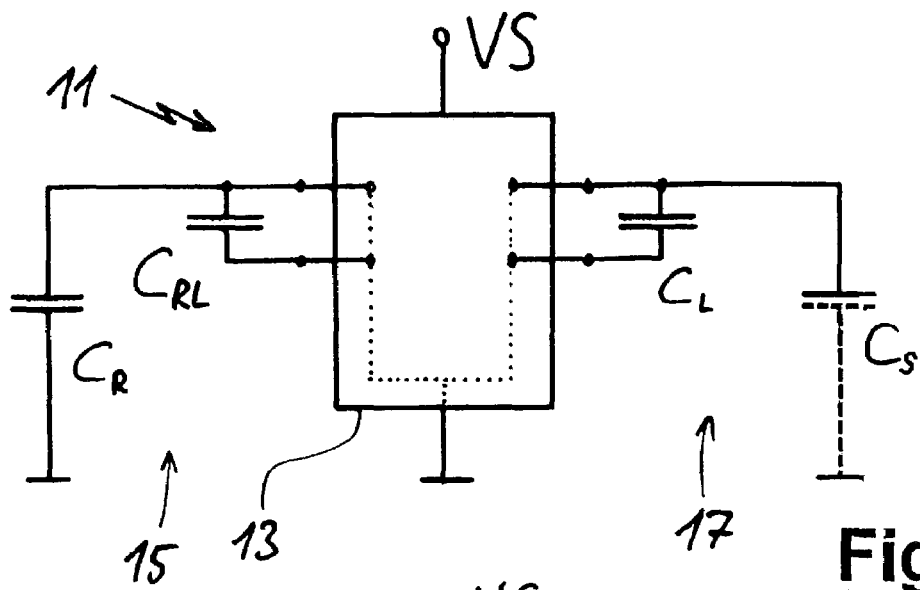

The present invention relates to an electric circuit for at least one capacitive sensor element. Advantageously, the circuit controls such a sensor element in a touch switch and analyzes and recognizes triggering of the switch.

Such a circuit is known, for example, from U.S. Pat. No. 5,973,417. In that circuit, the complexity of the circuit has already been relatively reduced. The aim, however, is to further reduce the circuit complexity.

PROBLEM AND SOLUTION

The invention is based on the problem of providing a circuit as mentioned above and further reducing the circuit complexity for controlling and analyzing a capacitive sensor element. Furthermore, the susceptibility to interference is to be improved, in particular in case of fluctuations of the supply voltage for the circuit.

This problem is resolved by a circuit for at least one capacitive sensor element, with the circuit designed as a switch capacitor circuit for the sensor element and is provided with a micro controller. The circuit is provided with at least one sensor branch, which contains the sensor element and a charging capacitor. The sensor element has a non-triggered state and a charged state. The charging capacitor is charged with a charge of the sensor element until it reaches a certain voltage. The sensor branch is connected with the micro controller, which is provided with a reference circuit, wherein the reference circuit has a reference charging capacitor and a reference capacitance which are in a known ratio with a capacitance of the sensor element in the non-triggered state. The micro controller compares a number of charge processes in the sensor branch with the number of the charge processes in the reference circuit until a certain voltage is reached.

According to the invention, the circuit is designed as the commonly known switch capacitor circuit for controlling and analyzing the sensor element. For this purpose, it is equipped with a micro controller. The sensor element is located in a sensor branch as part of the circuit. The sensor branch also contains the charging capacitor. According to the principle of the switch capacitor circuit, the sensor element is first charged in a first step, and the charging capacitor is in turn charged with the charge of the sensor element in a second step. The capacitance of the sensor element is therefore chosen much lower than the capacitance of the charging capacitor. For this reason, a large number of charge transfer processes are required until the charging capacitor is charged to a level that a certain potential is reached at the charging capacitor. This set potential is preferably the switching threshold of the micro controller or of the circuit, but it may also be a different potential.

If the sensor element is now triggered, its capacitance increases significantly. In this manner, it can accommodate a higher charge and the number of required charge transfer processes onto the charging capacitor until it reaches the switching threshold is significantly lowered. This reduced number of charge transfer processes is detected and recognized as triggering of the sensor element or the touch switch.

In order to improve the circuit according to the invention, the circuit or the micro controller includes a reference circuit with a reference capacitance. This reference capacitance is in a known ratio to the sensor element in the non-triggered state. In addition, a reference charging capacitor is provided in the reference circuit. This creates a so-called reference branch.

According to the invention, the reference capacitor is charged in a first step, similar to the case of the sensor element. This charge is transferred to the reference charging capacitor in a second step until the switching threshold of the reference charging capacitor is reached. The ratio between reference capacitance and sensor element capacitance is known. It is then possible to compare the number of charge transfer processes in the reference branch, under consideration of the ratio between sensor element capacitance and reference capacitance, with the number of charge transfer processes in the sensor branch. This can eliminate the fluctuation in the supply voltage, and thus the switching threshold. According to the invention, greater fault protection of the circuit is achieved with a very simple design. The greater independence from fluctuations in the supply voltage, in particular, has the advantage that the power supply of the circuit can be designed more simply. This can lead to considerable cost savings. As can be seen from this, the main advantage of such a reference circuit is that interference with the circuit through one source or another can be suppressed or compensated for. For example, temperature drifting can be compensated for because the charging capacitor and the reference charging capacitor drift in the same direction.

Normally, fluctuation of the supply voltage has the disadvantage that it affects the switching threshold as well. If the switching threshold changes, the number of necessary charge transfer processes changes as well. This in turn makes clear detection of the triggering difficult. The fluctuation of the supply voltage for simple circuits can be up to 20%. This already significantly influences the switching threshold, and therefore the functional precision of a touch switch, for example.

Instead of the switching threshold, it is possible to use any arbitrary potential as the comparison value, as described above. For example, a comparator or an AD converter can be employed to use a different value. The switching threshold can be a certain potential, with respect to 0 Volts. Alternatively, it can be reached by a potential decreasing from 5 Volts, for example.

The reference capacitor can be provided in the micro controller itself. For example, it can be determined by the construction of the micro controller. In this case, it is sufficient to determine the reference capacitance for a certain type of micro controller or to determine the previously-mentioned ratio between the capacitance of the sensor element and the reference capacitance.

Alternatively, a separate reference capacitor can be provided as a reference capacitance. In this case, it is suggested to implement the reference circuit in a separate reference branch. It is advantageous to design this branch basically identically to a sensor branch. For this purpose, the reference capacitance can be provided as a capacitor connected to zero. In addition, there is a reference charging capacitor with a capacitance that preferably corresponds to the capacitance of the charging capacitor of the sensor branch.

Preferably, the reference capacitance in particular when using a separate reference capacitor, is on the order of magnitude of the capacitance of the non-triggered sensor element. Most preferably, they are equal. The result is a basically equal number of charge transfer processes in the non-triggered state of the sensor element until the switching threshold is reached.

Such a capacitance of the sensor element or the reference capacitor can be in the range of several pF in the non-triggered state. Approximately 5 pF is considered advantageous. The capacitance of the charging capacitor is chosen to be much higher again. It is between 10 nF and 1 µF for example. Approximately 100 nF is considered particularly advantageous. The above-mentioned supply voltage of the micro controller is advantageously about 5 Volt.

In further embodiments of the invention, a micro controller can contain several sensor branches, it is possible to provide several sensor elements for one micro controller, for example one closed control unit and a number of touch switches.

In addition, the circuit can contain at least one resistor to improve the Electro Magnetic Compatibility (EMC) properties. In this manner, interferences may be dampened. Advantageously, the resistor is provided in the reference circuit. It is also possible, however, to provide a resistor in the sensor branch.

The sensor element could basically be any capacitive sensor element. Advantageous is a three-dimensional, spatially deformable body made of conducting synthetic material, such as foam plastic. Such a sensor element for example is described in U.S. Pat. No. 5,917,165, the respective content of which is incorporated into this description by explicit reference. A sensor element is most preferably designed to be pressed on the bottom of a cover. The top part of the cover in this case can be a touch surface for the touch switch.

In one possible embodiment of the invention, several sensor branches can be connected each to its own input or port of the micro controller. This embodiment is advantageous if the number of sensor branches is not too high, for example two to four.

In an alternative embodiment of the invention, in particular when using a large number of sensor branches, several sensor branches can be connected to the micro controller via switches in a multiplex design. This design permits a very large number of sensor branches or sensor elements per micro controller. The switches used can be of different types. Advantageously, they are analog switches. Transistors or relays may be used as well. Providing such switches and multiplexing is not very costly or complex. Preferably, the reference circuit is also connected to the micro controller with a switch. In this case multiplexing is not required. This can compensate for the effects of the switches, which generally have a certain capacity, for example.

This and other properties can be seen not only in the claims but also in the description and the drawings, wherein individual characteristics may be used either alone or in sub-combinations as an embodiment of the invention and in other areas and may individually represent advantageous and patentable embodiments, for which a patent claim is made here. Embodiments of the invention are shown in the drawings and explained in detail in the following.

SHORT DESCRIPTION OF THE DRAWINGS

Figure 2:
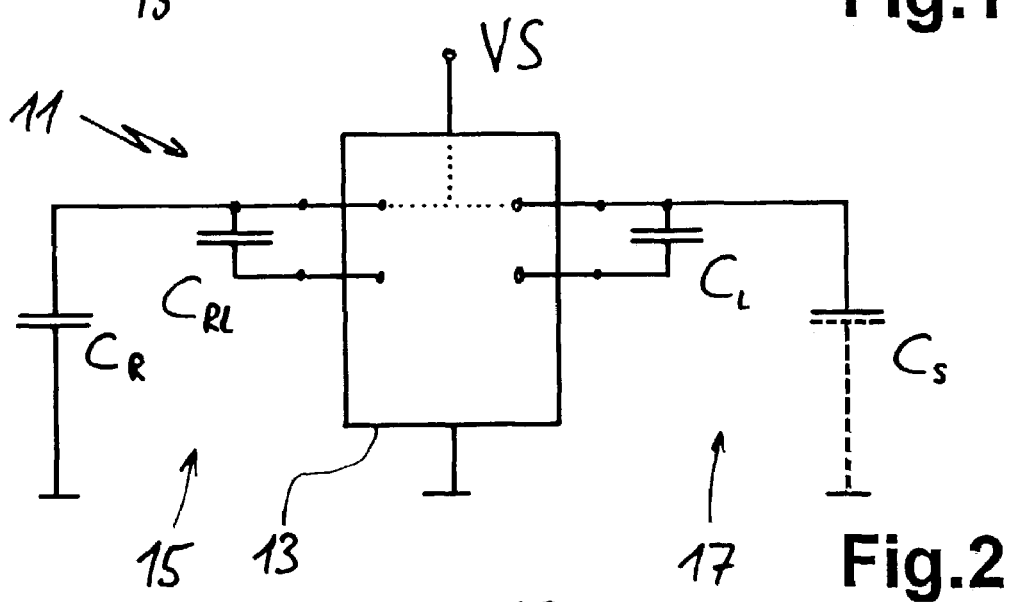
Figure 3:
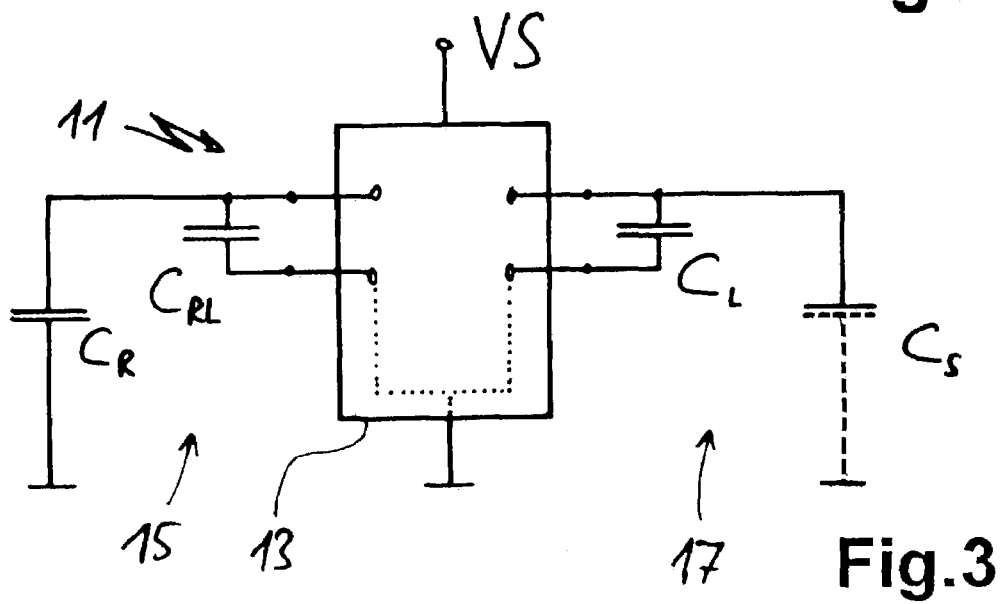
Figure 4:
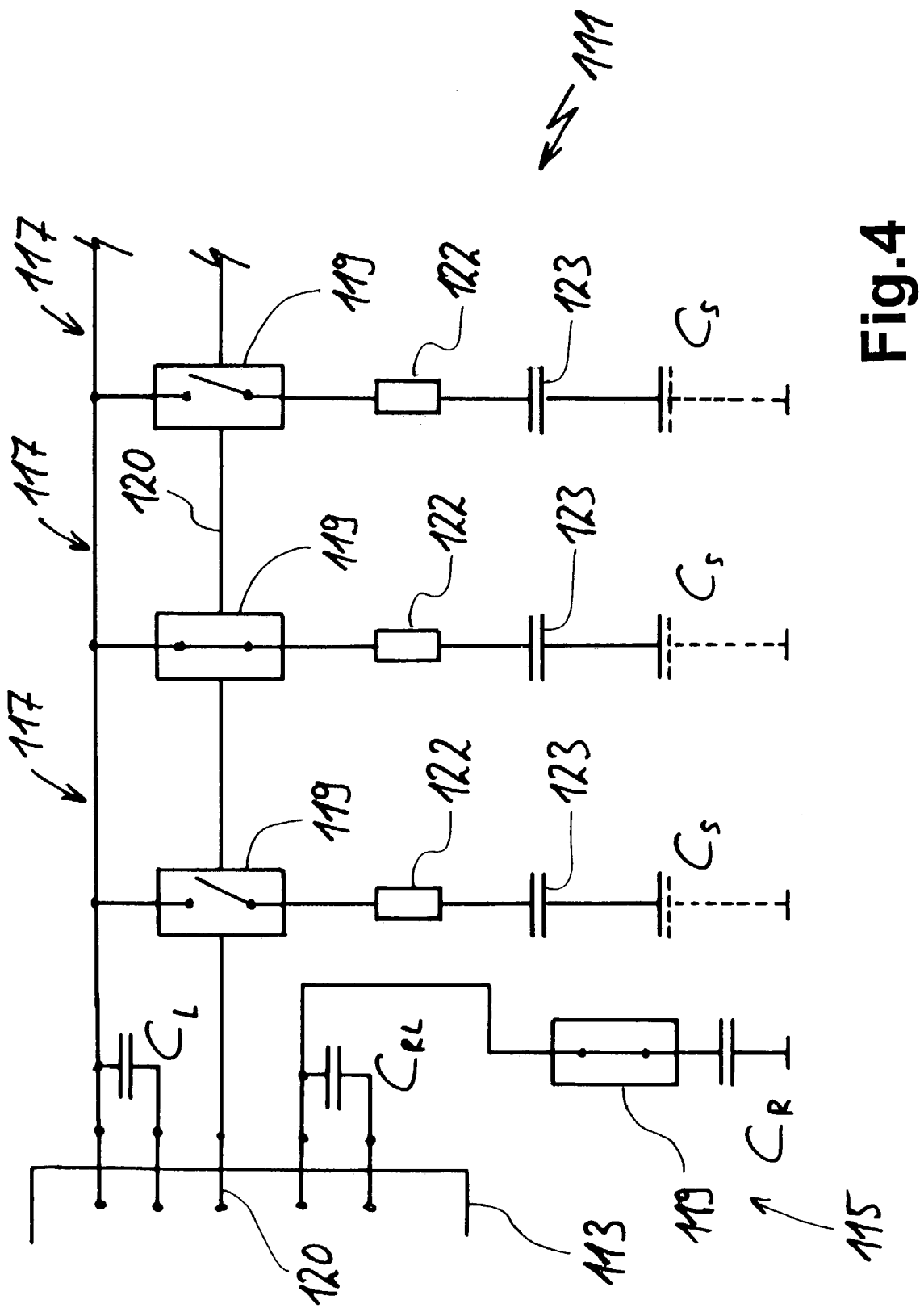
Figure 5:
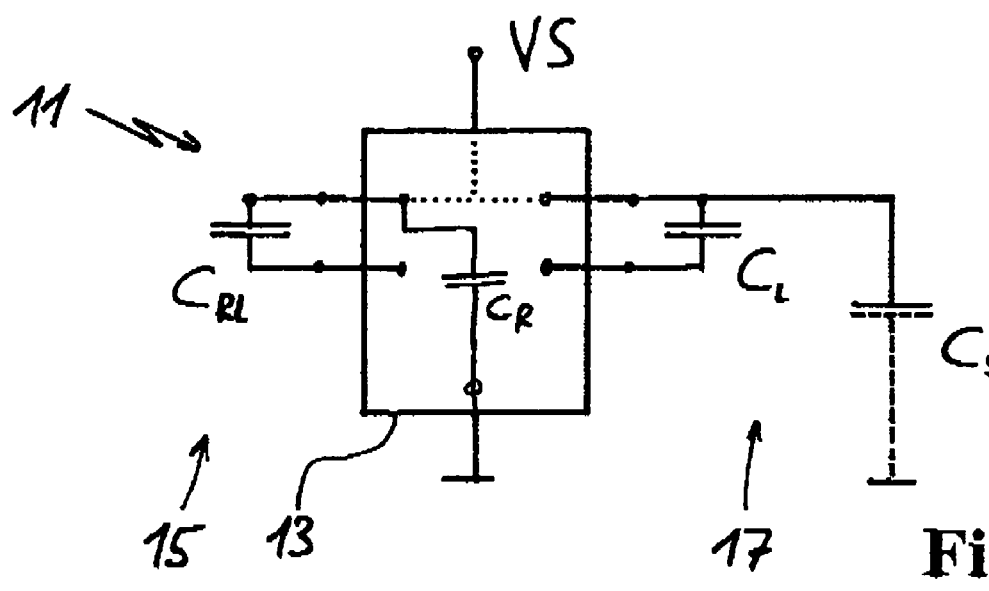
Figure 6:
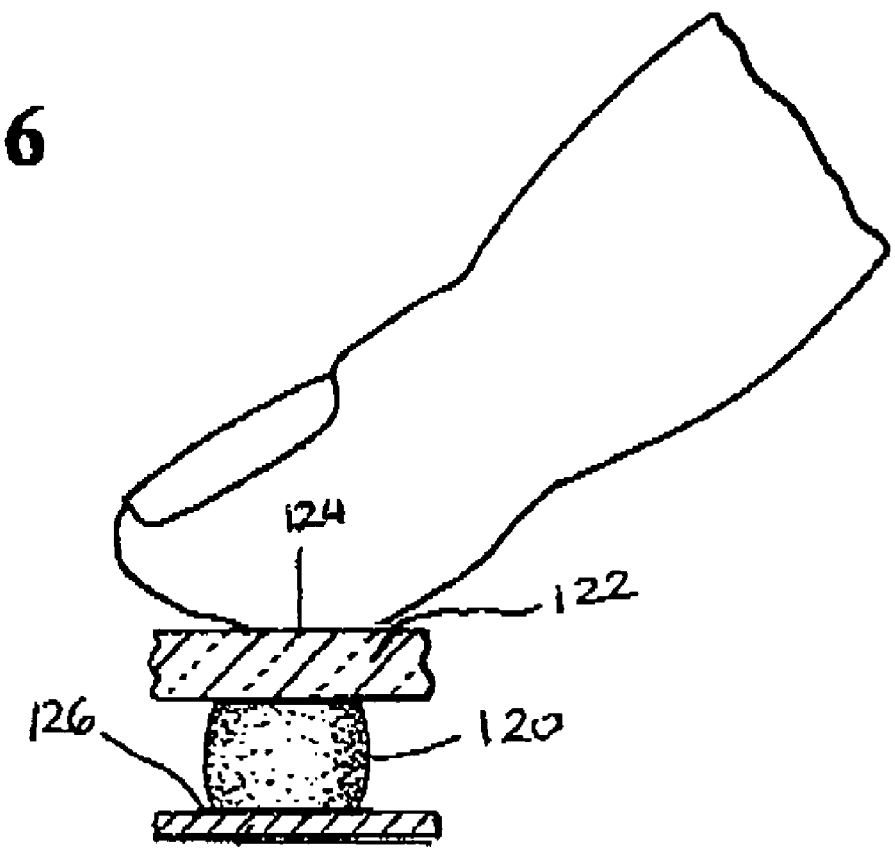

Embodiments of the invention are shown in the drawings and explained in detail in the following. The drawings show:

FIG. 1 a representation of a circuit with sensor branch and reference branch, during the discharge of the capacitors, FIG. 2 the circuit in FIG. 1 during charging of the sensor element, FIG. 3 the circuit in FIG. 2 when transferring the charge from the sensor element to the charging capacitor, FIG. 4 a sample circuit with a large number of sensor branches, which are connected to the micro controller via analog switches and multiplexing, FIG. 5 a modification of the circuit in FIG. 2 with the reference capacitor $C_R$ in the micro controller, and FIG. 6 shows the sensor element in contact with a cover that forms a touch surface for a touch switch.

DETAILED DESCRIPTION OF THE EMBODIMENTS

The sample circuits in the figures are schematic and have been reduced to the essential functional elements required to understand and explain the invention.

In FIGS. 1 to 3, one circuit 11 is represented in each case, which is designed according to an embodiment of the invention. In this case, a micro controller 13 is provided, which is connected to a supply voltage VS. A reference branch 15 is connected to two ports of the micro controller 13 on the left. This branch consists of a reference charging capacitor $C_{RL}$ and a reference capacitor $C_R$ connected to zero.

On the right side of the micro controller 13, a sensor branch 17 is connected to two additional ports. It is also possible to provide additional identical sensor branches here.

The sensor branch 17 has a capacitor $C_L$ as charging capacitor, as in the reference branch 15. In addition, it contains the sensor element $C_S$. It is shown partially dashed. This should illustrate that basically only in the triggered state, i.e. when the finger of a user makes contact for example, the sensor element $C_S$ is a capacitor connected to zero.

The supply voltage can be approximately 5 Volts. The capacitance of the charging capacitors $C_L$ and $C_{RL}$ can be approximately 100 nF. The capacitance of the sensor elements $C_S$ and the reference capacitor $C_R$ can be approximately 5 pF, for example.

With the dotted line in the micro controller 13, different internal switch states can be represented. FIG. 1 shows how all the capacitors are discharged, in a third state in which the capacitors discharge and prepare to be re-charged to the non-triggered state. FIG. 2 shows how the sensor elements $C_S$ and the reference capacitor $C_R$ are each charged to the supply voltage VS.

In the next step in FIG. 3, the charge is transferred from the sensor elements $C_S$ and the reference capacitor $C_R$ to the charging capacitors $C_L$ and $C_{RL}$, respectively. As the capacitance of the charging capacitor $C_L$ is many times higher than the capacitance of the sensor elements $C_S$ and the capacitance of the charging capacitor $C_{RL}$ is many times higher than the reference capacitor $C_R$, and in the case of the selected values by a factor of 20,000, several thousand charge processes are required to reach the switching threshold of the micro controller 13. This threshold is generally approximately 1.3 Volts. As soon as the charging capacitors are charged to the said 1.3 Volts after a sufficient number of charge transfer processes, the micro switches. The number of charge transfer processes can be determined in advance.

If the sensor element $C_S$ is now triggered, its capacitance increases significantly. This means that its capacitance is much higher than the reference capacity $C_R$. Consequently, it can store more charge during the charging processes, which is then transferred to the charging capacitor $C_L$. When the sensor element $C_S$ is triggered, more charge can be transferred to the charging capacitors with fewer charge transfer processes. As a result, it reaches the switching threshold with fewer charge transfer processes than the reference branch. As it is no longer necessary to determine the absolute number of charge transfer, processes, but rather the number of charge transfer processes in the sensor branch is compared with that of the reference branch, effects of the supply voltage fluctuation on the switching threshold can be disregarded. Furthermore, it can be seen that the circuit 11 basically works according to the principle of the switch capacitor circuit.

The micro controller 13 can be connected to a large number of sensor branches 17 as long as free ports are available.

With the shown circuit according to the invention, the switching threshold is no longer required as an absolute value. By comparison with the reference branch, the values of which are in a certain ratio with the sensor branch, or equal to it in a triggered state, the switching threshold of the micro controller is a guide value for both circuit branches and its absolute value is therefore not important.

In further embodiments of the invention it is also possible not to have a separate element for the reference capacitor $C_R$. An existing capacitance in the micro controller 13, which cannot be completely avoided, can be used as well (as illustrated in FIG. 5). Even if it has a capacitance that is different from the sensor element $C_S$, it is at least possible to determine the ratio between the two. This ratio can be taken into account during the comparison of the number of required charge transfer processes until the switching threshold is reached.

Another option of controlling several sensor branches with one micro controller 13 if the controller does not have a large number of ports is shown in FIG. 4. In this case, several sensor branches 117 are provided. They are each connected to a port of the micro controller 113 via analog switches 119. The analog switches 119 are controlled by a controller 120. This control is preferably done according to a multiplex method, which does not need to be described in detail here because it can be implemented according to a well-known design. With such a circuit 111 according to FIG. 4, a large number of sensor elements $C_S$ can be operated by one simple micro controller 113.

In addition to the sensor elements $C_S$, resistors 122 and capacitors 123 are provided in the sensor branches in order to improve the interference properties, more particularly the EMC properties. As known from existing designs, a charging capacitor $C_L$ is provided.

In order for the reference branch 115 to behave basically in the same manner as the sensor branches 117, an analog switch 119 is provided there in addition to the reference capacitor $C_R$ and the reference charging capacitor $C_{RL}$. However, this switch may remain closed permanently because it is not affected by the multiplexing.

Another advantage of the provided reference branches 15 and 115 is that it is possible to compensate for the temperature sensitivity of the charging capacitors $C_L$.

The sensor element can basically be any capacitive sensor element. Advantageous is a three-dimensional, spatially deformable body 120 made of conducting synthetic material, such as foam plastic. Such a sensor element for example is described in U.S. Pat. No. 5,917,165, the respective content of which is incorporated into this description by explicit reference. A sensor element 120 is most preferably designed to be pressed on the bottom of a cover 122, as illustrated in FIG. 6. The top part of the cover 122 can be a touch surface 124 for a touch switch. The sensor body 120 can be mounted on a contact plate 126.

Advantageously, the measurement is performed during the zero crossing of the supply voltage. This has the advantage, in particularly for power supplies that are not galvanically separated, that the potential difference between the sensor element and ground, which is the installation frame of a cooking element for example, is very low or approaches zero.

Advantageously, the measurement is performed during the zero crossing of the supply voltage. This has the advantage, in particularly for power supplies that are not galvanically separated, that the potential difference between the sensor element and zero, which is the installation frame of a cooking element for example, is very low or approaches zero.

The invention claimed is:

1. A touch switch device with an electric circuit for at least one capacitive sensor element, wherein:
   the circuit is designed as a switch capacitor circuit for the sensor element and is provided with a micro controller,
   the circuit is provided with at least one sensor branch,
   the sensor branch contains the sensor element and a charging capacitor,
   the sensor element has a non-triggered state and a charged state,
   the charging capacitor is charged with a charge of the sensor element responsive to a touch by a user on the touch switch until it reaches a switching voltage, wherein the sensor element is repeatedly charged to a first charge in a first step, and the charging capacitor is in turn charged with the first charge in a second step;
   the sensor branch is connected with the micro controller,
   the micro controller is provided with a reference circuit, wherein the reference circuit has a reference charging capacitor and a reference capacitance which are in a known ratio with a capacitance of the sensor element in the non-triggered state, wherein the reference capacitance is repeatedly charged to a reference charge in a first reference step, and the reference charging capacitor is in turn charged with the reference charge in a second reference step, and
   the micro controller compares a number of charge processes in the sensor branch associated with repeatedly transferring the first charge from the sensor element to the charging capacitor with the number of the charge processes in the reference circuit associated with repeatedly transferring the reference charge from the reference capacitance to the reference charging capacitor until said switching voltage is reached;
   wherein the reference capacitance corresponds approximately to the capacitance of the non-triggered sensor element, and
   wherein the reference capacitance is provided in the micro controller.

2. The touch switch device according to claim 1, wherein the capacitance of the sensor element in the non-triggered state is 5 pF.

3. The touch switch device according to claim 1, wherein the capacitance of the charging capacitor is between 10 nF and 1 µF.

4. The touch switch device according to claim 1, wherein the capacitance of the reference charging capacitor is between 10 nF and 1 µF.

5. The touch switch device according to claim 1, wherein the micro controller has a plurality of sensor branches.

6. The touch switch device according to claim 1, wherein there is provided a resistor in the circuit to improve EMC properties of the circuit relative to interference properties of the circuit without said resistor.

7. The touch switch device according to claim 6, wherein the resistor to improve the EMC properties is provided in the reference circuit.

8. The touch switch device according to claim 1, wherein the sensor element is made of a conducting synthetic material, wherein the sensor element is designed to be in contact with a bottom of a cover, wherein a top of the cover is a touch surface for the touch switch.

9. The touch switch device according to claim 1, wherein the micro controller is provided with inputs and several sensor branches are connected each to its own input of the micro controller.

10. The touch switch device according to claim 1, wherein several sensor branches are connected to the micro controller with multiplexing via one analog switch each.

11. A touch switch device with an electric circuit for at least one capacitive sensor element, wherein:
the circuit is designed as a switch capacitor circuit for the sensor element and is provided with a micro controller,
the circuit is provided with at least one sensor branch,
the sensor branch contains the sensor element and a charging capacitor,
the sensor element has a non-triggered state and a charged state,
the charging capacitor is charged with a charge of the sensor element responsive to a touch by a user on the touch switch until it reaches a switching voltage, wherein the sensor element is repeatedly charged to a first charge in a first step, and the charging capacitor is in turn charged with the first charge in a second step;
the micro controller is provided with a reference circuit, wherein the reference circuit has a reference charging capacitor and a reference capacitance which are in a known ratio with a capacitance of the sensor element in the non-triggered state, wherein the reference capacitance is repeatedly charged to a reference charge in a first reference step, and the reference charging capacitor is in turn charged with the reference charge in a second reference step, and
the micro controller compares a number of charge processes in the sensor branch associated with repeatedly transferring the first charge from the sensor element to the charging capacitor with the number of the charge processes in the reference circuit associated with repeatedly transferring the reference charge from the reference capacitance to the reference charging capacitor until said switching voltage is reached;
wherein the reference capacitance corresponds approximately to the capacitance of the non-triggered sensor element, and
wherein the sensor element is made of a conducting synthetic material, wherein the sensor element is designed to be in contact with a bottom of a cover, wherein a top of the cover is a touch surface for the touch switch.

12. The touch switch device according to claim 11, wherein the reference capacitance is provided in the micro controller.

13. The touch switch device according to claim 11, wherein the reference capacitance is a separate reference capacitor and the reference circuit is a separate reference branch.

14. The touch switch device according to claim 13, wherein the reference branch is analogous to the sensor branch.

15. The touch switch device according to claim 11, wherein the capacitance of the sensor element in the non-triggered state is 5 pF.

16. The touch switch device according to claim 11, wherein the capacitance of the charging capacitor is between 10 nF and 1 µF.

17. The touch switch device according to claim 11, wherein the capacitance of the reference charging capacitor is between 10 nF and 1 µF.

18. The touch switch device according to claim 11, wherein the micro controller has a plurality of sensor branches.

19. The touch switch device according to claim 11, wherein there is provided a resistor in the circuit to improve EMC properties of the circuit relative to interference properties of the circuit without said resistor.

20. The touch switch device according to claim 19, wherein the resistor to improve the EMC properties is provided in the reference circuit.

21. The touch switch device according to claim 11, wherein the micro controller is provided with inputs and several sensor branches are connected each to its own input of the micro controller.

22. The touch switch device according to claim 11, wherein several sensor branches are connected to the micro controller with multiplexing via one analog switch each.

23. The touch switch device according to claim 22, wherein the reference capacitance is connected to the micro controller via an analog switch.

24. A touch switch device with an electric circuit for at least one capacitive sensor element, wherein:
the circuit is designed as a switch capacitor circuit for the sensor element and is provided with a micro controller,
the circuit is provided with at least one sensor branch,
the sensor branch contains the sensor element and a charging capacitor,
the sensor element has a non-triggered state and a charged state,
the charging capacitor is charged with a charge of the sensor element responsive to a touch by a user on the touch switch until it reaches a switching voltage, wherein the sensor element is repeatedly charged to a first charge in a first step, and the charging capacitor is in turn charged with the first charge in a second step;
the sensor branch is connected with the micro controller,
the micro controller is provided with a reference circuit, wherein the reference circuit has a reference charging capacitor and a reference capacitance which are in a known ratio with a capacitance of the sensor element in the non-triggered state, wherein the reference capacitance is repeatedly charged to a reference charge in a first reference step, and the reference charging capacitor is in turn charged with the reference charge in a second reference step, and
the micro controller compares a number of charge processes in the sensor branch associated with repeatedly transferring the first charge from the sensor element to the charging capacitor with the number of the charge processes in the reference circuit associated with repeatedly transferring the reference charge from the reference capacitance to the reference charging capacitor until said switching voltage is reached;
wherein the reference capacitance corresponds approximately to the capacitance of the non-triggered sensor element, and
wherein several sensor branches are connected to the micro controller with multiplexing via one analog switch each.

25. The touch switch device according to claim 24, wherein the reference capacitance is connected to the micro controller via an analog switch.

* * * * *